United States Patent
Gao

(10) Patent No.: US 11,696,422 B2
(45) Date of Patent: Jul. 4, 2023

(54) HIGHLY SERVICEABLE IMMERSION COOLING STRUCTURAL DESIGN FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 134 days.

(21) Appl. No.: 17/405,814

(22) Filed: Aug. 18, 2021

(65) Prior Publication Data

US 2023/0059446 A1 Feb. 23, 2023

(51) Int. Cl.
*H05K 7/20* (2006.01)
*H05K 5/03* (2006.01)

(52) U.S. Cl.
CPC ............... *H05K 7/208* (2013.01); *H05K 5/03* (2013.01); *H05K 7/203* (2013.01); *H05K 7/20318* (2013.01)

(58) Field of Classification Search
CPC ............... H05K 7/203; H05K 7/20272; H05K 7/20781; H05K 7/20818; H05K 7/20318; H05K 7/20281; H05K 7/208; H05K 1/0203; H05K 5/023; H05K 5/0217; H05K 7/1487; H05K 7/20636; G06F 1/20; G06F 2200/201; G06F 1/181; H01L 23/44; H01L 23/473; H01L 23/32; F28D 1/0213; F28D 2021/0028
See application file for complete search history.

(56) References Cited

U.S. PATENT DOCUMENTS

| | | | | |
|---|---|---|---|---|
| 10,624,237 | B2 * | 4/2020 | Enright | B25J 11/00 |
| 11,559,160 | B2 * | 1/2023 | Gagnon | A47J 27/10 |
| 2016/0234970 | A1 * | 8/2016 | Shelnutt | H05K 7/203 |
| 2017/0172011 | A1 * | 6/2017 | Chen | H05K 7/20636 |
| 2017/0295676 | A1 * | 10/2017 | Conn | H05K 7/20772 |
| 2018/0084671 | A1 * | 3/2018 | Matsumoto | H05K 7/20772 |
| 2022/0087050 | A1 * | 3/2022 | Jia | H05K 7/20809 |
| 2022/0322572 | A1 * | 10/2022 | Chehade | G06F 1/20 |
| 2022/0361366 | A1 * | 11/2022 | Hsieh | H05K 7/20763 |
| 2022/0361381 | A1 * | 11/2022 | Sweeney | H05K 7/20836 |
| 2023/0026658 | A1 * | 1/2023 | Lin | H05K 7/20318 |

* cited by examiner

*Primary Examiner* — Mandeep S Buttar
(74) *Attorney, Agent, or Firm* — Womble Bond Dickinson (US) LLP

(57) ABSTRACT

A two phase coolant immersion system includes a top section and an immersion section, where the top section and the immersion section are separated by one or more panels. The immersion section includes at least a number of server slots to receive a number of servers, where each of the servers is at least partially submerged within two phase liquid coolant within the immersion section, where, when the servers operate, the servers generate heat that is transferred to the two phase liquid coolant causing some of the two phase liquid coolant to turn into a vapor. The two phase coolant immersion system includes a condensing section interfaced with the immersion section, where the condensing section includes a vapor collection compartment to collect two phase liquid coolant in vapor phase and a liquid collection compartment situated beneath the vapor collection compartment. The one or more panels prevent vapor loss to the environment.

20 Claims, 7 Drawing Sheets

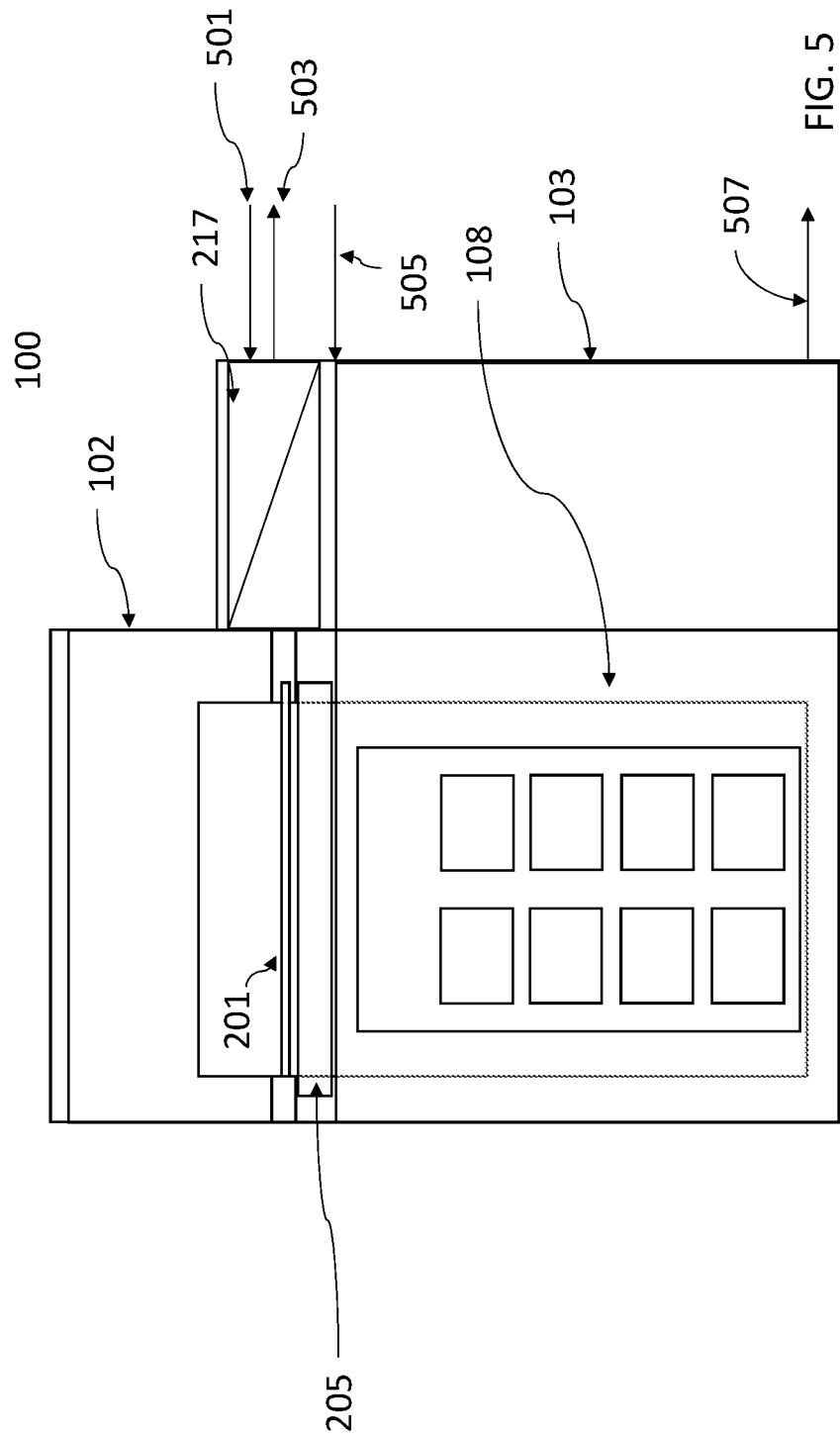

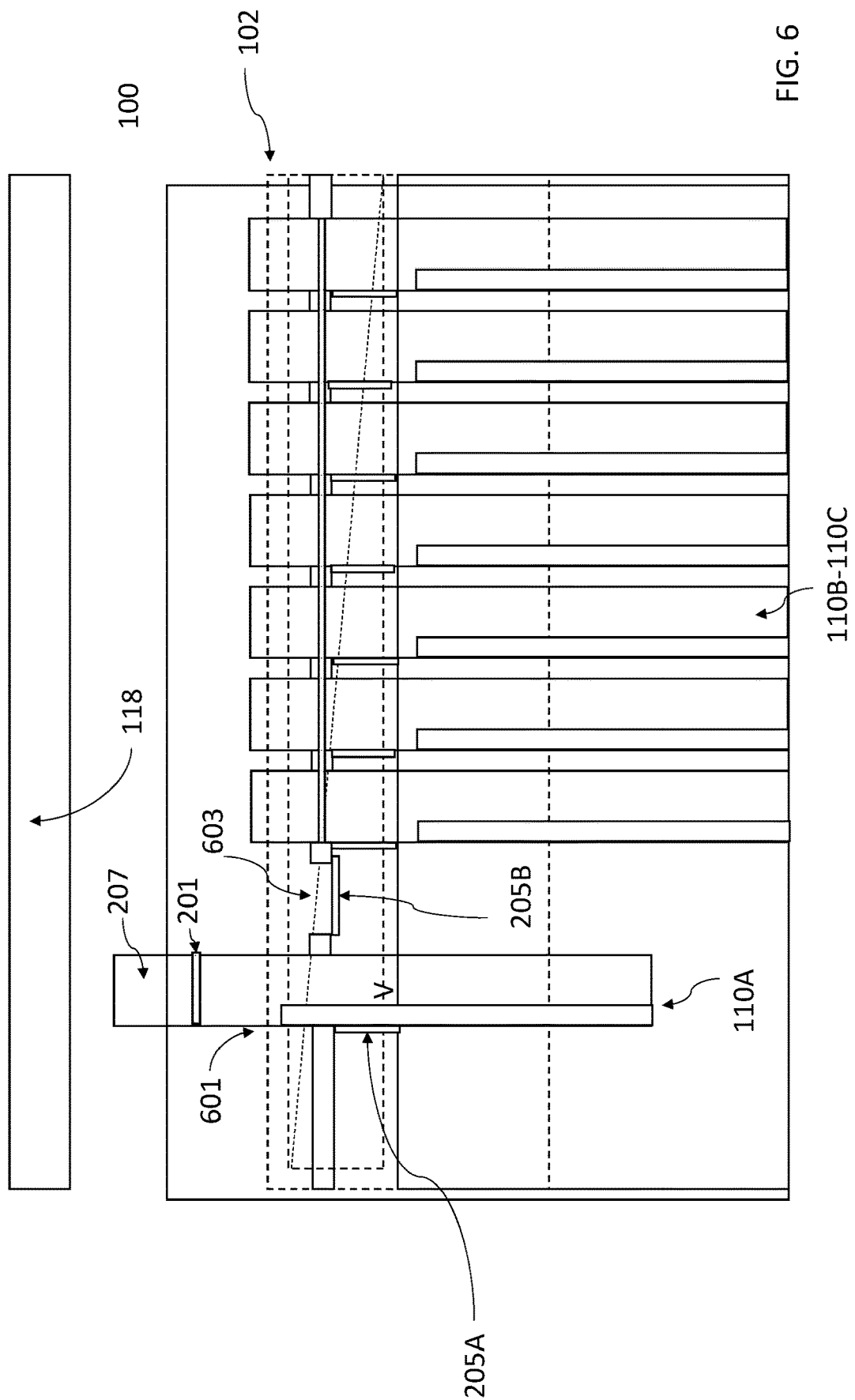

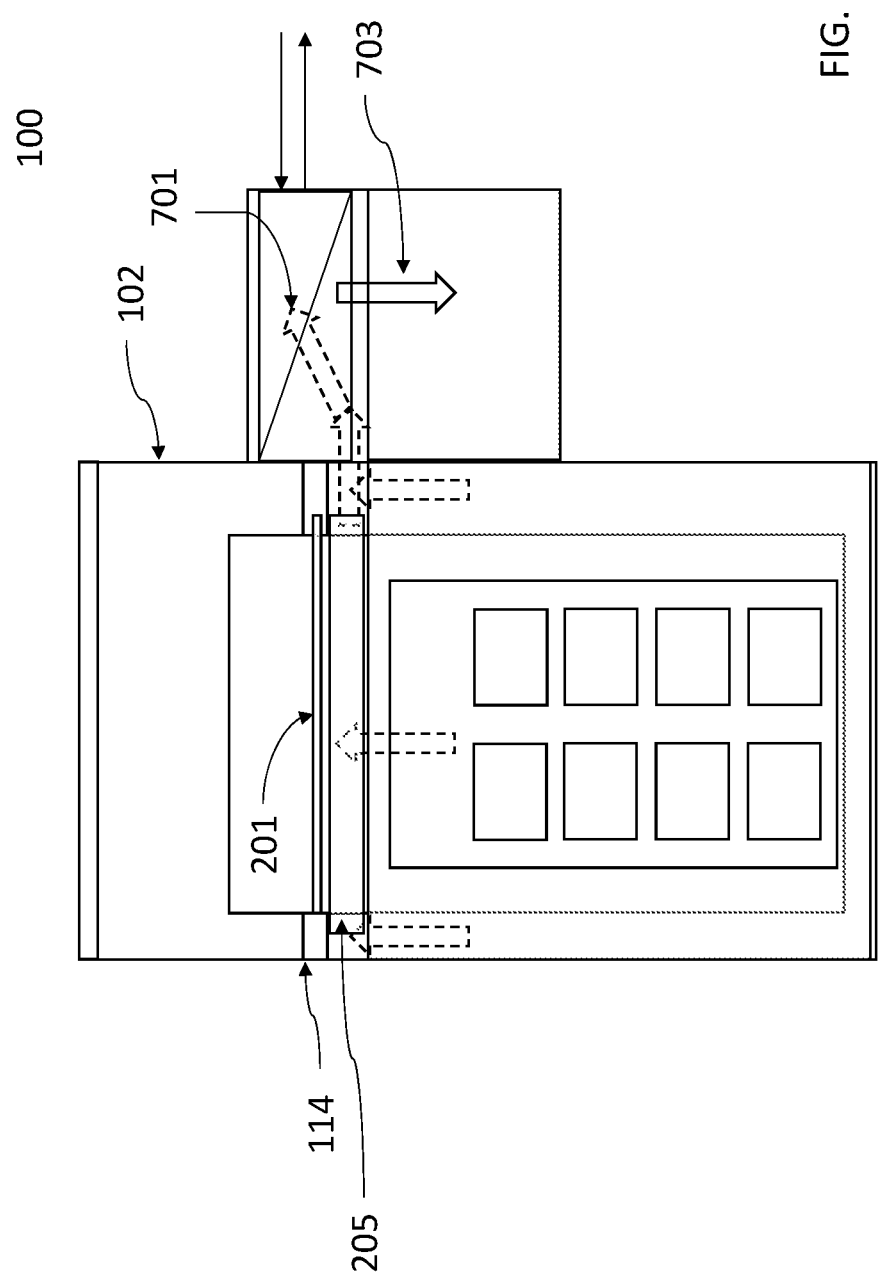

HIGHLY SERVICEABLE IMMERSION COOLING STRUCTURAL DESIGN FOR SERVERS

FIELD OF THE INVENTION

Embodiments of the present invention relate generally to server and data center cooling. More particularly, embodiments of the invention relate to a highly serviceable immersion cooling structural design for servers.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air handler (CRAH) unit that is a device that intakes hot exhaust return air and supplies cooling air to maintain a data center's thermal environment.

Recently, data centers have been deploying high-power density electronic racks, where more high-density chips are packaged closer together to provide more computing power. Cooling these high-density racks by maintaining a proper thermal environment may be an issue with existing cooling systems, such as a CRAH unit. For instance, although the CRAH unit may maintain the thermal environment with more conventional (or lower-density) racks, the unit may be unable to effectively cool high-power density racks because they may generate heat load at a higher rate due to the higher density electronics. Or significant cost may be needed for upgrading a CRAH system to satisfy a cooling requirement of a high density deployment. Another challenge for air cooling high density racks is moving a large amount of airflow sufficient to cool the racks.

Immersion cooling, on the other hand, which involves at least partially submerging electronics in a non-conductive dielectric solution is a feasible solution for high-density electronics. Implementing immersion cooling in existing data centers, however, has challenges. For example, a data center's cooling infrastructure may need to be modified to be able to operate in an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center. As another example, conventional two phase immersion cooling systems include a condenser that is packaged within an immersion tank along with the submerged electronics (e.g., positioned above the electronics). When maintenance is performed (e.g., when a server needs to be replaced), a data center onsite operator must remove the condenser from the tank, thereby breaking the existing cooling loop which may lead to a loss of dielectric solution. In addition, in order to prevent overheating while performing maintenance, the electronics within the tank may be shut down, which results in service interruption.

Existing solutions for electronic rack immersion system do not efficient solve the challenges of ease of deployment or serviceability, and at the same time minimize losses of two phase fluid. In the existing solutions, operating one server may cause significant impact on other servers of the immersion system when an enclosure lid of the immersion system opens.

BRIEF DESCRIPTION OF THE DRAWINGS

Embodiments of the invention are illustrated by way of example and not limitation in the figures of the accompanying drawings in which like references indicate similar elements.

FIG. 5 is a block diagram illustrating a side view of a cooling system with a condensing section according to one embodiment.

FIG. 6 is a block diagram of a cooling system illustrating a cover lid being opened according to one embodiment.

FIG. 7 is a block diagram of a cooling system illustrating paths for two phase coolant in vapor and liquid phases according to one embodiment.

DETAILED DESCRIPTION

Figure 1:
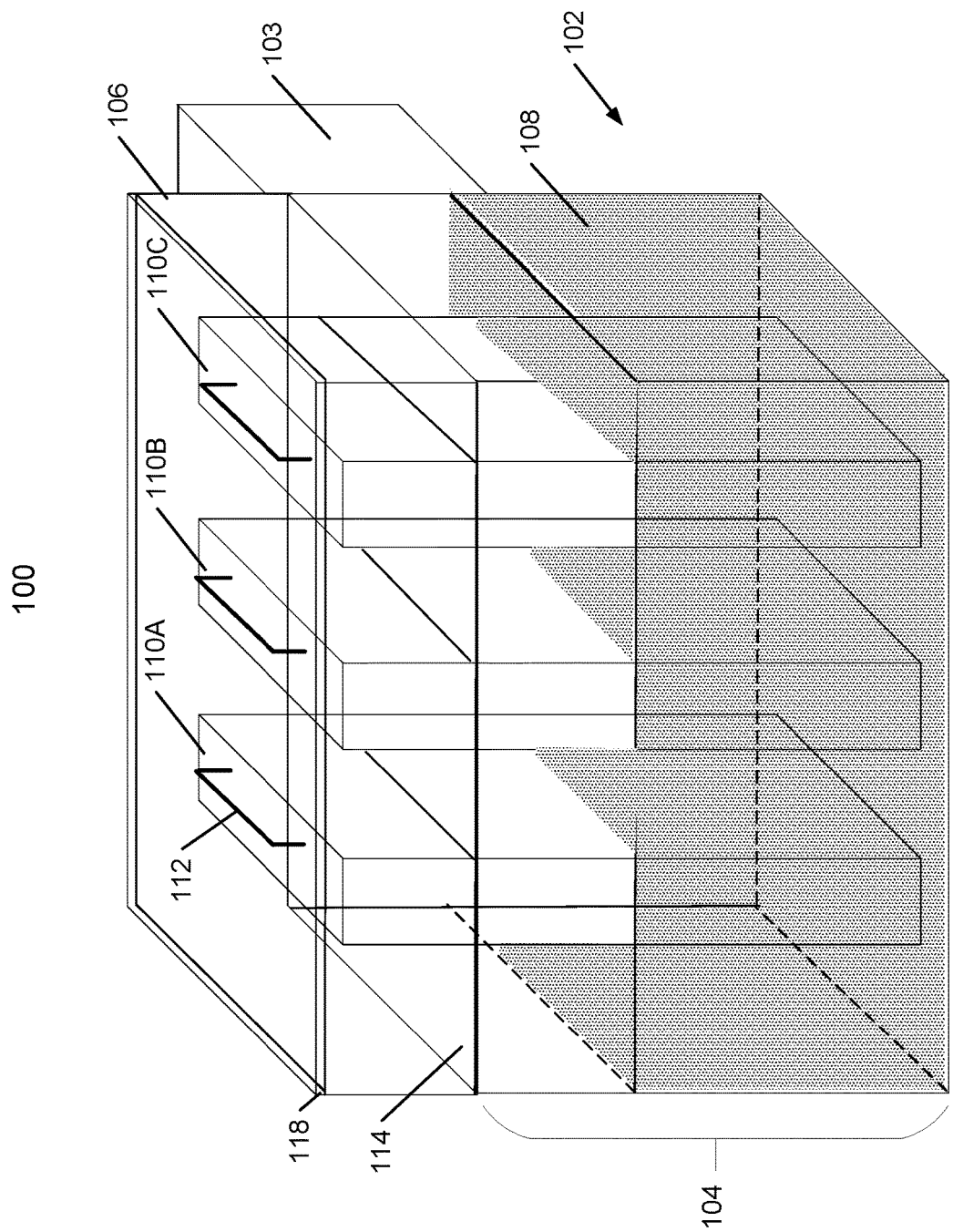
FIG. 1 is a block diagram illustrating a perspective view of a cooling system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Existing solutions for operating two phase immersion system requires immersion tank built-in condensing unit within the immersion tank of the immersion system. Such solutions lack the flexibility of removal of the condensing cooling system from the immersion tank for maintenance and services. In addition, an operation such as opening the lid for servicing the server may significantly impact the performance of the condensing unit. In addition, the condensing cooling system cannot be easily switched to higher storage/cooling capacity. Furthermore, the existing solutions include complex design on the facility side to deliver coolant to the immersion tank and may loss certain amount of vapor during regular operation of the two phase immersion system.

The solution proposed in the current design provides a highly efficient server and immersion system co-design to deploy and operate servers in a two phase immersion cooling system. The solution enables a highly efficient two phase fluid operation as further described in FIGS. 1-7.

According to a first aspect, a two phase coolant immersion system of a data center includes a top section and an immersion section, where the top section and the immersion section are separated by one or more panels. The immersion section includes at least one of the one or more panels, and a number of server slots to receive a number of servers, where each of the servers is at least partially submerged within two phase liquid coolant within the immersion section, where, when the servers operate, the servers generate heat that is transferred to the two phase liquid coolant thereby causing at least some of the two phase liquid coolant to evaporate into a vapor.

The two phase coolant immersion system includes a condensing section interfaced with the immersion section, where the condensing section includes a vapor collection compartment having one or more condensing coils therein, and a liquid collection compartment situated beneath the vapor collection compartment, where the vapor collection compartment collects the two phase liquid coolant in vapor phase that is entering the condensing section, and where the liquid collection compartment collects the two phase liquid coolant in liquid phase when the two phase liquid coolant in vapor phase are condensed to liquid phase by the condensing coils.

In an embodiment, the condensing coils are at an elevation above a two phase liquid coolant level of the immersion section. In one embodiment, the condensing coils are separable from the condensing section. In an embodiment, the condensing section is packaged adjacent to the immersion section and is separable from the top section and the immersion section of the two phase coolant immersion system for services and maintenance.

In an embodiment, the top section includes a first panel covering a portion of the immersion section along a cross section of the immersion section, and one or more second panels covering a remaining portion of the cross section, where each of the one or more second panels are secured to a rotatable hinge that is attached to the first panel or to the immersion section. In an embodiment, the top section includes a removable cover lid to seal the top section in an airtight environment when the removable cover lid is placed on the top section or to allow access to an interior of the top section when the removable cover lid is removed.

In an embodiment, a rotational hinge of a second panel is connected to the immersion section, where when the second panel is pressed down, the rotational hinge gives way to allow the second panel to deflect and to provide an open access between the top section and the immersion section. In an embodiment, when a pressing pressure at the second panel is released, the rotational hinge causes the second panel to close the open access to seal the immersion section in an air tight environment.

In an embodiment, each of the one or more servers comprises a third panel, where when a server is placed in the immersion section, the third panel of the server substitutes a second panel to seal the immersion section in an air tight environment. In an embodiment, the one or more panels include a first panel of the top section, one or more second panels attached to the immersion section and that are deflectable, and one or more third panels that are attached to the one or more servers. In an embodiment, the immersion section includes a liquid level sensor to maintain a level of the two phase liquid coolant to be lower than the one or more panels, where a gap between the one or more second panels and a surface of the two phase liquid coolant serve as a pathway for vapor to enter from the immersion section to the vapor collection compartment of the condensing section.

According to a second aspect, a data center includes one or more two phase coolant immersion systems. Each two phase coolant immersion system of the data center includes a top section and an immersion section, where the top section and the immersion section are separated by one or more panels. The immersion section includes at least one of the one or more panels, and a number of server slots to receive a number of servers, where each of the servers is at least partially submerged within two phase liquid coolant within the immersion section, where, when the servers operate, the servers generate heat that is transferred to the two phase liquid coolant thereby causing at least some of the two phase liquid coolant to turn into a vapor.

The two phase coolant immersion system includes a condensing section interfaced with the immersion section, where the condensing section includes a vapor collection compartment having one or more condensing coils therein, and a liquid collection compartment situated beneath the vapor collection compartment, where the vapor collection compartment collects the two phase liquid coolant in vapor phase that is entering the condensing section, and where the liquid collection compartment collects the two phase coolant in liquid phase when the two phase liquid coolant in vapor phase are condensed to liquid phase by the condensing coils.

FIG. 1 is a block diagram illustrating a perspective view of a cooling system 100 according to one embodiment. Specifically, FIG. 1 shows an IT equipment cooling system 100 (which hereafter may be referred to as cooling system) that is configured to immersion cool a plurality of IT equipment/computing devices. The cooling system 100 can include an electronic rack 102 having at least an immersion section 104 and a top section 106. In one embodiment, electronics rack 102 and the immersion tank, the two terms are interchangeably in the present work. In one embodiment, top section 106 and immersion section 104 of electronic rack 102 may be an immersion tank and formed from one type of material (e.g., an alloy, etc.). The immersion section 104 has a cooling liquid, such as two phase coolant 108, contained therein. As illustrated in FIG. 1, system 100 can include a first panel 114 separating the top section 106 from the immersion section 104, and can include a number of computing devices, such as one or more servers 110A-110C that can be at least partially submerged in the two phase coolant 108 at immersion section 104. Note that the immersion section 104 in FIG. 1 can include a liquid region and a vapor region. Immersion section 104 can be understood as the region where the two phase coolant recirculates, e.g., the evaporation and condensation. The plurality of computing devices disposed in immersion section 104 may include any type and quantity of devices. The plurality of computing devices can include computing devices that are part of a data center. The one or more servers 110A-110C can include a printed circuit board (PCB) with electronic components mounted on them. The one or more servers 110A-110C can be contained in a chassis frame 207 (further shown in FIG. 2) which can include a handle 112 to facilitate an easy installation of the servers 110A-110C at cooling rack 102. The chassis frame 207 is further described in detail below in conjunction with FIG. 2, each chassis frame can include a second panel 205. The handle 112 can also allow the one or more servers 110A-110C to be easily pulled out for maintenance. The one or more servers 110A-110C can also be installed within chassis frame 207 providing a support system configured to support and contain one or more servers 110A-110C. In one embodiment, rack 102 may include a lid 118. In one embodiment, servers 110A-110C can be fully contained within rack 102. The server or server blade (e.g., 110A) within the chassis frame 207 can be submerged in immersion section 104 containing non-conductive cooling fluid/liquid, e.g., two phase coolant 108. Note that the two phase liquid immersion cooling process allows heat to transfer by evaporation and condensation processes. For example, two phase coolant 108 that comes into contact with server blade 110A having electronic components (e.g., CPU ASIC, or GPU), may heat two phase coolant 108 to a boil and causes coolant 108 to change to a vapor phase. The vapor can enter a condensing section 103, as further shown in FIG. 2. The vapor will then condense by cooling condenser coil at the condensing section and the vapor condenses back to a fluid bath at the condensing section. Through this process of evaporation and condensation, heat from the electronic components of the servers 101A-101C can be dissipated. Through the two phase liquid immersion cooling process implemented by the cooling system 100 described above, the server blade 110A having electronics components (e.g., CPU or GPU) can operate at temperatures a lot higher than the normal air cooling. The cooling system 100 allows the server blade 110A to run at higher power to achieve higher performance without additional design considerations for the cooling system. In addition, the server blade 110A can be packaged a lot closer and a lot more server blade 110A can be installed within the same space (e.g., a data center) ensuring a high density server blade within the cooling system 100 in a data center. Through this two phase liquid immersion cooling process, computing power densities can be multiplied in a same form factor, which means the packaging power density can be increase, and at the same time the operating thermal environment can be maintained.

As illustrated in FIG. 1, rack 102 can be configured to contain one or more servers 110A-110C and two phase coolant 108. Servers 110A-110C can be at least partially submerged in two phase coolant 108. While illustrated in FIG. 1 as including a limited number of specific components, a system in accordance with one or more embodiments may include fewer, additional, and/or different components.

Figure 2:
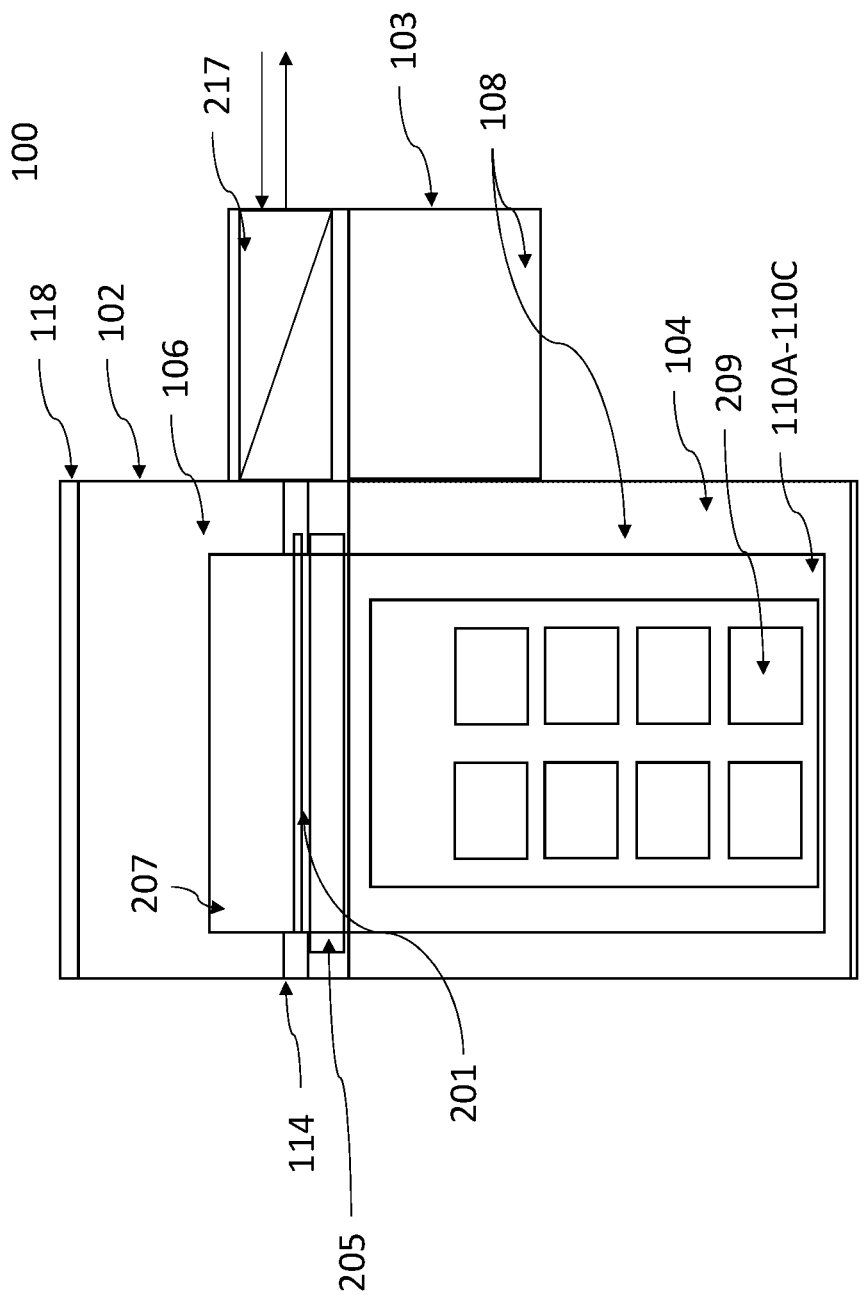
FIG. 2 is a block diagram illustrating a side view of a cooling system according to one embodiment.

FIG. 2 is a block diagram illustrating a side view of cooling system 100 according to one embodiment. As described above, cooling system 100 can include three sections, which are top section 106, immersion section 104, and condensing section 103. Condensing section 103 can be designed separately from top section 106 and immersion section 104, while the three sections can operate as one unit. It needs to be mentioned that the elevation of a portion of the condensing section 103, e.g., a location of condensing coils 217 in condenser unit, is above a liquid level of two phase coolant within immersion section 104. Top section 106 and immersion section 104 can be separated by one or more panels 114, 201, 205. The panels 114, 201, 205 can include a first panel 114 fixed on the immersion section, one or more server panels 201 fixed to respective server frames 207 of one or more servers 110A-110C, and one or more rotatable panels 205 attached to first panel 114 or attached to immersion section 104. The one or more servers 110A-110C can be housed in server frames 207 having top server portions. One or more servers 110A-110C can be immerged in immersion section 104 having two phase coolant 108 contained therein, without top server portions being submerged in the two phase coolant. Here, two phase coolant in vapor phase is to be condensed by condensing coils 217 within a vapor collection compartment of condensing section 103, where two phase coolant in liquid phase is then collected in a liquid compartment of condensing section 103, and the collected two phase coolant is to flow back to immersion section 104. Although, one or more servers are described with respect to FIG. 1, the one or more servers 110A-110C can be any printed circuit board electronics having electronic chips 209.

In one embodiment, rotatable panels 205 of the immersion section seals air in the immersion section when servers are not populated at a corresponding server slot. Rotatable panels 205 can be pressed down to causes rotatable panels 205 to deflect and open access from top section to immersion section. When servers are being installed, one or more rotatable panels 205 are open. Once servers are installed, server panels 201 takes the place of the rotatable panels 205 to seal in air within the immersion section.

Figure 3:
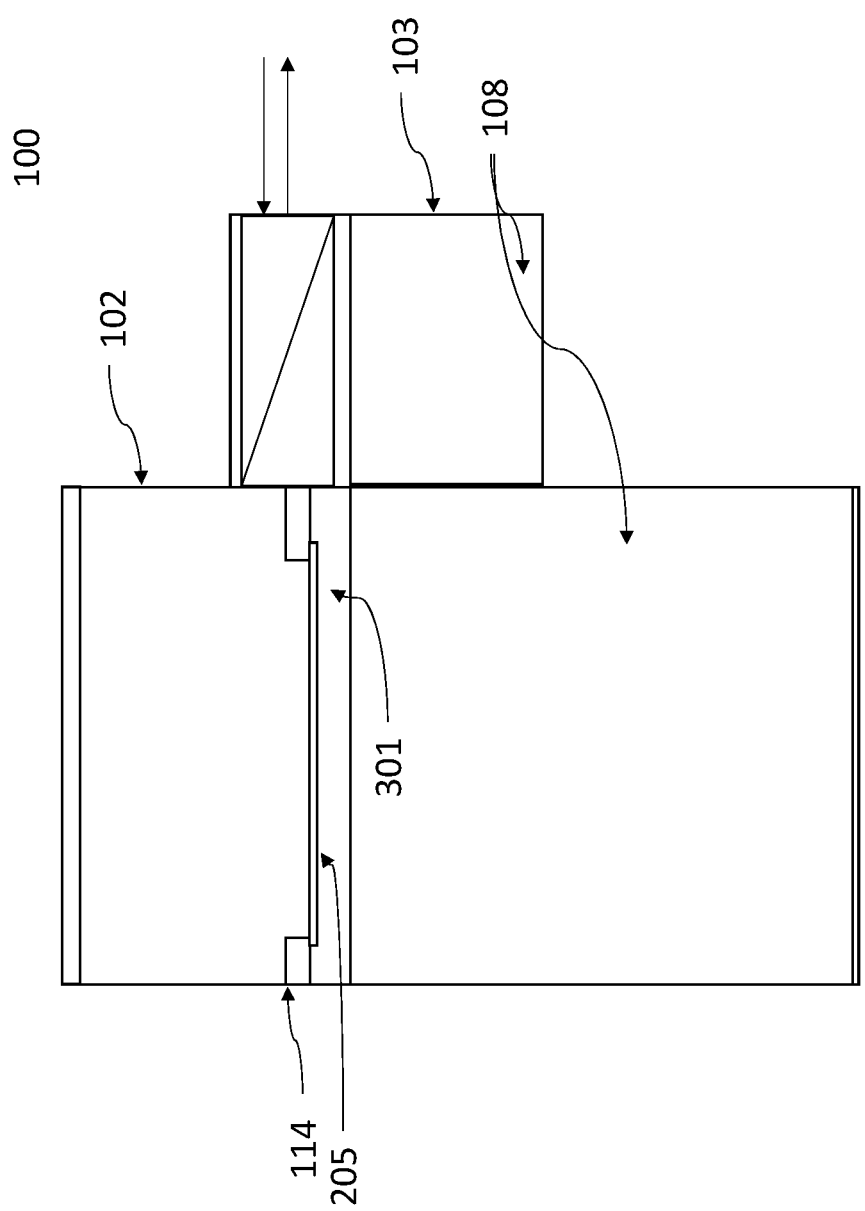
FIG. 3 is a block diagram illustrating a side view of a cooling system with no server being populated according to one embodiment.

FIG. 3 is a block diagram illustrating a side view of a cooling system 100 with no server being populated according to one embodiment. It needs to be mentioned that immersion section 104 can include a fluid level sensor (not shown) to maintain immersion fluid 108 to be lower than first panel 114 and rotatable panels 205, where a gap 301 between a surface of immersion fluid 108, and first panel 114 and/or rotatable panels 205 is used as a vapor path for vapor to exit from immersion section 104 and to enter a vapor collection compartment of condensing section 103.

Figure 4:
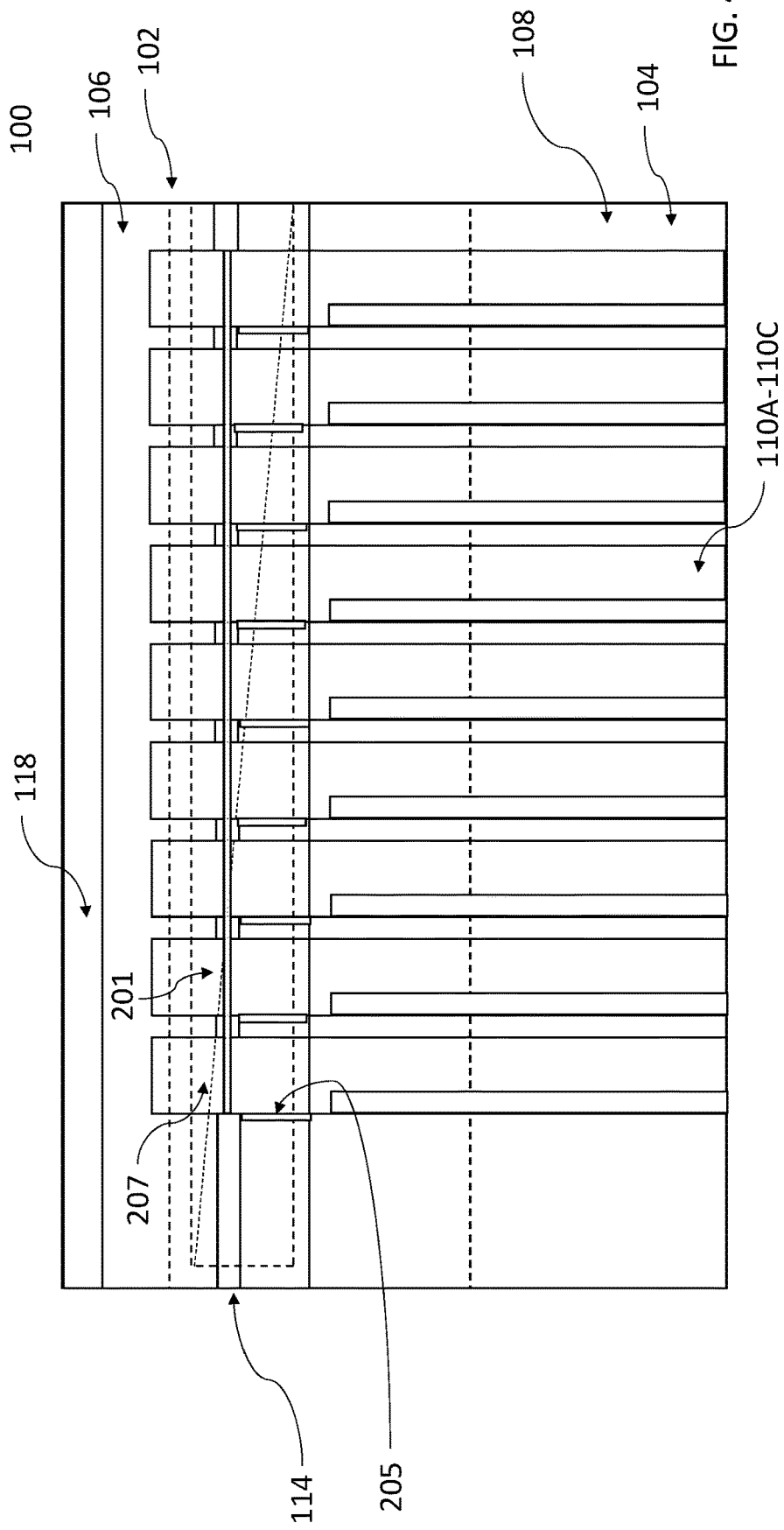
FIG. 4 is a block diagram illustrating a front view of a cooling system with a plurality of servers populated according to one embodiment.

FIG. 4 is a block diagram illustrating a front view of a cooling system 100 with a plurality of servers 110A-110C populated according to one embodiment. It can be seen that first panel 114 and corresponding server panels 201 of server frames for the servers 110A-110C and/or rotatable panels 205, form a segregation of top section 106 and immersion section 104.

FIG. 5 is a block diagram illustrating a side view of a cooling system 100 with a condensing section 103 according to one embodiment. Condensing section 103 can be designed with different form factors. It can be seen that condensing section 103 can have a same form factor as rack 102. In one embodiment, condensing coil 217 is at a location higher than fluid level of two phase coolant 108. In FIG. 5, the rotatable panel 205 is shown at the opening position, with the server being inserted. Some of the key design considerations for condensing section 103 are: cooling capacity and different deployment scenarios, and data center level fluid inlet/outlet layouts.

In one embodiment, rack 102 includes one or more fluid arrangement loops. For example, as shown in FIG. 5, condensing coils 217 can be coupled to a liquid cooling loop/source via inlet 501 and outlet 503. The liquid cooling loop/source can circulate a cooling liquid, such as water, to cool condensing coils 217. In one embodiment, liquid collection compartment of condensing section 103 can be coupled to a two phase fluid coolant supply/return, e.g., a second coolant source, via inlet 505 and outlet 507, to fill and release two phase coolant at liquid collection compartment from a facility level two phase liquid coolant source. The two loops may be operated separately.

FIG. 6 is a block diagram of a cooling system 100 illustrating a cover lid 118 being opened according to one embodiment. In this case, cooling system 100 can remain in operation when lid 118 is open, since rack 102 is designed to seal in two phase coolant 118 with immersion section 104, away from top section 106. For example, two phase coolant 118 in vapor phase can be contained within immersion section 104 even when lid 118 is open from top section 106. In a first scenario, servers 110A-110C can either be in the process of being installed or uninstalled, as shown for server 110A at slot 601. In a second scenario, no server is being populated and rotation panel 205B is closed, as shown for slot 603. In a third scenario, servers 110B-110C are populated. For these scenarios, panels 114, 201, and/or 205 seals vapor within immersion section 104. For example, panel 201 replaces panel 205A at a physical location of panel 205A once server 110A is installed. Thus, such a design minimizes leak of two phase coolant in vapor phase even when lid 118 is open.

FIG. 7 is a block diagram of a cooling system illustrating paths for two phase coolant in vapor and liquid phases according to one embodiment. It can be seen that cooling system 100 has vapor flow paths 701 and liquid coolant flow path 703. Within flow paths 701-703, cooling system 100 can seal in vapor using first panel 114, rotatable panels 205, and/or server panels 201. Thus, cooling system 100 can minimize vapor loss, while allowing operators to access servers 110A-110C for maintenance and services with ease.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A two phase coolant immersion system of a data center, comprising:
   a top section;
   an immersion section, wherein the top section and the immersion section are separated by one or more panels, wherein the immersion section comprises the one or more panels and a plurality of server slots to receive a plurality of servers, wherein each of the servers is at least partially submerged within two phase liquid coolant within the immersion section, wherein, when the servers operate, the servers generate heat that is transferred to the two phase liquid coolant thereby causing at least some of the two phase liquid coolant to turn into a vapor; and
   a condensing section interfaced with the immersion section, wherein the condensing section comprises:
      a vapor collection compartment having one or more condensing coils therein; and
      a liquid collection compartment situated beneath the vapor collection compartment, wherein the vapor collection compartment collects the two phase liquid coolant in vapor phase that is entering the condensing section, and wherein the liquid collection compartment collects the two phase liquid coolant in liquid phase when the two phase liquid coolant in a vapor phase are condensed to liquid phase by the condensing coils.

2. The immersion system of claim 1, wherein the condensing coils are separable from the condensing section.

3. The immersion system of claim 1, wherein the condensing section is packaged adjacent to the immersion section and separable from the top section and the immersion section of the two phase coolant immersion system for services and maintenance.

4. The immersion system of claim 1, wherein the immersion section includes a first panel of the one or more panels covering a portion of the immersion section along a cross section of the immersion section, and one or more second panels of the one or more panels covering a remaining portion of the cross section, wherein each of the one or more second panels are secured to a rotatable hinge that is attached to the first panel or to the immersion section.

5. The immersion system of claim 1, wherein the top section includes a removable cover lid to seal the top section in an airtight environment when the removable cover lid is placed on the top section or to allow access to an interior of the top section when the removable cover lid is removed.

6. The immersion system of claim 1, wherein a rotational hinge of a second panel of the one or more panels is connected to the immersion section, wherein when the second panel is pressed down, the rotational hinge gives way to allow the second panel to deflect and to provide an open access between the top section and the immersion section.

7. The immersion system of claim 6, wherein when a pressing pressure at the second panel is released, the rotational hinge causes the second panel to close the open access to seal the immersion section in an air tight environment.

8. The immersion system of claim 1, wherein each of the plurality of servers comprises a third panel of the one or more panels, wherein when a server is placed in the immersion section, the third panel of the server substitutes a second panel to seal the immersion section in an air tight environment.

9. The immersion system of claim 1, wherein the one or more panels comprise a first panel of the immersion section, one or more second panels attached to the immersion section and that are deflectable, and one or more third panels that are attached to the plurality of servers.

10. The immersion system of claim 1, wherein the immersion section includes a liquid level sensor to maintain a level of the two phase liquid coolant to be lower than the one or more panels, wherein a gap between one or more second panels of the one or more panels and a surface of the two phase liquid coolant serve as a pathway for vapor to enter from the immersion section to the vapor collection compartment of the condensing section.

11. A data center, comprising:
   an array of two phase coolant immersion systems, wherein each of the two phase coolant immersion systems comprises:
      a top section;
      an immersion section, wherein the top section and the immersion section are separated by one or more panels, wherein the immersion section comprises the one or more panels and a plurality of server slots to receive a plurality of servers, wherein each of the servers is at least partially submerged within two phase liquid coolant within the immersion section, wherein, when the servers operate, the servers generate heat that is transferred to the two phase liquid coolant thereby causing at least some of the two phase liquid coolant to turn into a vapor; and
      a condensing section interfaced with the immersion section, wherein the condensing section comprises:
         a vapor collection compartment having one or more condensing coils therein; and
         a liquid collection compartment situated beneath the vapor collection compartment, wherein the vapor collection compartment collects the two phase liquid coolant in vapor phase that is entering the condensing section, and wherein the liquid collection compartment collects the two phase liquid coolant in liquid phase when the two phase liquid coolant in vapor phase are condensed to liquid phase by the condensing coils.

12. The data center of claim 11, wherein the condensing coils are separable from the condensing section.

13. The data center of claim 11, wherein the condensing section is packaged adjacent to the immersion section and separable from the top section and the immersion section of a corresponding two phase coolant immersion system for services and maintenance.

14. The data center of claim 11, wherein the immersion section includes a first panel of the one or more panels covering a portion of the immersion section along a cross section of the immersion section, and one or more second panels of the one or more panels covering a remaining portion of the cross section, wherein each of the one or more second panels are secured to a rotatable hinge that is attached to the first panel or to the immersion section.

15. The data center of claim 11, wherein the top section includes a removable cover lid to seal the top section in an airtight environment when the removable cover lid is placed on the top section or to allow access to an interior of the top section when the removable cover lid is removed.

16. The data center of claim 11, wherein a rotational hinge of a second panel of the one or more panels is connected to the immersion section, wherein when the second panel is pressed down, the rotational hinge gives way to allow the second panel to deflect and to provide an open access between the top section and the immersion section.

17. The data center of claim 16, wherein when a pressing pressure at the second panel is released, the rotational hinge causes the second panel to close the open access to seal the immersion section in an air tight environment.

18. The data center of claim 11, wherein each of the plurality of servers comprises a third panel of the one or more panels, wherein when a server is placed in the immersion section, the third panel of the server substitutes a second panel to seal the immersion section in an air tight environment.

19. The data center of claim 11, wherein the one or more panels comprise a first panel of the immersion section, one or more second panels attached to the immersion section and that are deflectable, and one or more third panels that are attached to the plurality of servers.

20. The data center of claim 11, wherein the immersion section includes a liquid level sensor to maintain a level of the two phase liquid coolant to be lower than the one or more panels, wherein a gap between one or more second panels of the one or more panels and a surface of the two phase liquid coolant serve as a pathway for vapor to enter from the immersion section to the vapor collection compartment of the condensing section.

* * * * *